(12) United States Patent
Lee

(10) Patent No.: US 8,569,997 B2
(45) Date of Patent: Oct. 29, 2013

(54) APPARATUS AND METHOD FOR DISPLAYING CAPACITY AND CHARGE/DISCHARGE STATE OF BATTERY IN PORTABLE DEVICE

(75) Inventor: Woo-Chang Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 464 days.

(21) Appl. No.: 13/008,326

(22) Filed: Jan. 18, 2011

(65) Prior Publication Data

US 2011/0187313 A1 Aug. 4, 2011

(30) Foreign Application Priority Data

Jan. 29, 2010 (KR) ........................ 10-2010-0008353

(51) Int. Cl.
*H02J 7/00* (2006.01)
*G01R 31/36* (2006.01)

(52) U.S. Cl.
USPC ........... 320/132; 320/107; 320/149; 324/426; 324/427; 324/428; 340/636.1; 340/636.21

(58) Field of Classification Search
USPC ........................................................ 320/132
See application file for complete search history.

(56) References Cited

U.S. PATENT DOCUMENTS

| | | | | |
|---|---|---|---|---|
| 5,153,496 A | * | 10/1992 | LaForge | 320/119 |
| 2005/0280396 A1 | * | 12/2005 | Hirata et al. | 320/132 |
| 2006/0091863 A1 | * | 5/2006 | Melichar | 320/132 |
| 2006/0097699 A1 | * | 5/2006 | Kamenoff | 320/132 |
| 2007/0236183 A1 | * | 10/2007 | Darilek | 320/132 |
| 2007/0247116 A1 | * | 10/2007 | Morita et al. | 320/132 |
| 2009/0009133 A1 | * | 1/2009 | Tange et al. | 320/132 |
| 2009/0179763 A1 | * | 7/2009 | Sheng | 340/636.1 |
| 2011/0187313 A1 | * | 8/2011 | Lee | 320/107 |

* cited by examiner

*Primary Examiner* — Yalkew Fantu
(74) *Attorney, Agent, or Firm* — Jefferson IP Law, LLP

(57) ABSTRACT

An apparatus and method for displaying battery capacity and a charge/discharge state of a portable device are provided. The apparatus includes a charge Integrated Circuit (IC) for providing current to recharge the battery using an external charge power source, a sensing resistance interposed between the battery and the charge IC, a switch connected to the sensing resistance in parallel and opened to flow the current to the sensing resistance when a capacity of the battery is measured, and a controller for determining the capacity of the battery using voltage values at both ends of the sensing resistance measured when the switch is opened.

20 Claims, 2 Drawing Sheets

APPARATUS AND METHOD FOR DISPLAYING CAPACITY AND CHARGE/DISCHARGE STATE OF BATTERY IN PORTABLE DEVICE

PRIORITY

The present application claims the benefit under 35 U.S.C. §119(a) to a Korean patent application filed in the Korean Intellectual Property Office on Jan. 29, 2010, and assigned Serial No. 10-2010-0008353, the entire disclosure of which is hereby incorporated by reference.

BACKGROUND OF THE INVENTION

1. Field of the Invention

The present invention relates to a portable device. More particularly, the present invention relates to an apparatus and a method for displaying capacity and a charge/discharge state in a portable device.

2. Description of the Related Art

Portable devices such as mobile phones are supplied with power from a battery in which a rechargeable battery is often used. The rechargeable battery has to be recharged at a proper time before becoming completely dead. For doing so, the portable devices provide a function which displays a current battery capacity to inform a user of a recharge time.

Conventional methods for determining and displaying the battery capacity are described below.

The most basic method for determining and displaying the battery capacity is a voltage measurement method. The voltage measurement method determines and displays the battery capacity by comparing a battery voltage with a discharge table that is based on the fact that the battery voltage decreases according to the discharge state of the battery. The voltage measurement method is implemented in terms of hardware with low cost due to small modules being used. However, the voltage measurement method may display an incorrect capacity because of a temporary increase or decrease of battery voltage due to a load of the device that is supplied from the battery and a reference voltage for displaying the remaining capacity is changed or fluctuated.

A Coulomb counting method determines the battery capacity by storing and accumulating an electric charge transported between the battery and the device, to a memory, and displays the remaining battery capacity. This method features easy software implementation and high accuracy. However, the Coulomb counting method includes high cost because an additional memory is required and the hardware is more complicated than the voltage measurement. Also, the Coulomb counting method includes a smaller capacity than a same-size battery because the information depends on the single battery and a measurement Integrated Circuit (IC) is to be installed to the battery. In comparison to the voltage measurement method, the voltage fluctuation is not a problem. However, when the accumulated data is shifted once after several charges and discharges, data is unreliable. Thus, it is necessary to reset the capacity by completely recharging or discharging the battery.

A voltage measurement compensation method, which is an enhanced version of the voltage measurement method, measures the voltage between the battery and a resistance by placing a sensing resistance between the battery and the device. The voltage measurement compensation method estimates and compensates for the current value using a difference between the resistance and the voltage based on a determined battery capacity value. Disadvantageously, the voltage measurement compensation method suffers from a low voltage supplied to the device due to the use of the sensing resistance and the increased battery consumption.

Therefore, a need exists for an efficient method for measuring a battery capacity and informing of a charge state or a discharge state.

SUMMARY OF THE INVENTION

An aspect of the present invention is to address at least the above-mentioned problems and/or disadvantages and to provide at least the advantages described below. Accordingly, an aspect of the present invention to provide an apparatus and a method for measuring and displaying a battery capacity in a portable device.

Another aspect of the present invention is to provide an apparatus and a method for informing of a charge state or a discharge state in a portable device.

Yet another aspect of the present invention is to provide an apparatus and a method for preventing power drop resulting from a sensing resistance which is used to measure a battery capacity in a portable device.

In accordance with an aspect of the present invention, a portable device using a rechargeable battery is provided. The portable device includes a charge Integrated Circuit (IC) for providing current to recharge the battery using an external charge power source, a sensing resistance interposed between the battery and the charge IC, a switch connected to the sensing resistance in parallel and opened to flow the current to the sensing resistance when a capacity of the battery is measured, and a controller for determining the capacity of the battery using voltage values at both ends of the sensing resistance measured when the switch is opened.

In accordance with another aspect of the present invention, an operating method of a portable device using a rechargeable battery is provided. The portable device includes a charge IC for providing current to recharge the battery using an external charge power source, a sensing resistance interposed between the battery and the charge IC, and a switch connected to the sensing resistance in parallel is provided. The method includes when a capacity of the battery is measured, making the current flow through the sensing resistance by opening the switch, measuring voltage values applied to both ends of the sensing resistance, and determining the capacity of the battery using the voltage values at both ends of the sensing resistance.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, like reference numerals will be understood to refer to like parts, components, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide.

Exemplary embodiments of the present invention provide an apparatus and a method for measuring and displaying battery capacity in a portable device and informing a user of whether the portable device is currently in a charge state or a discharge state.

Figure 1:
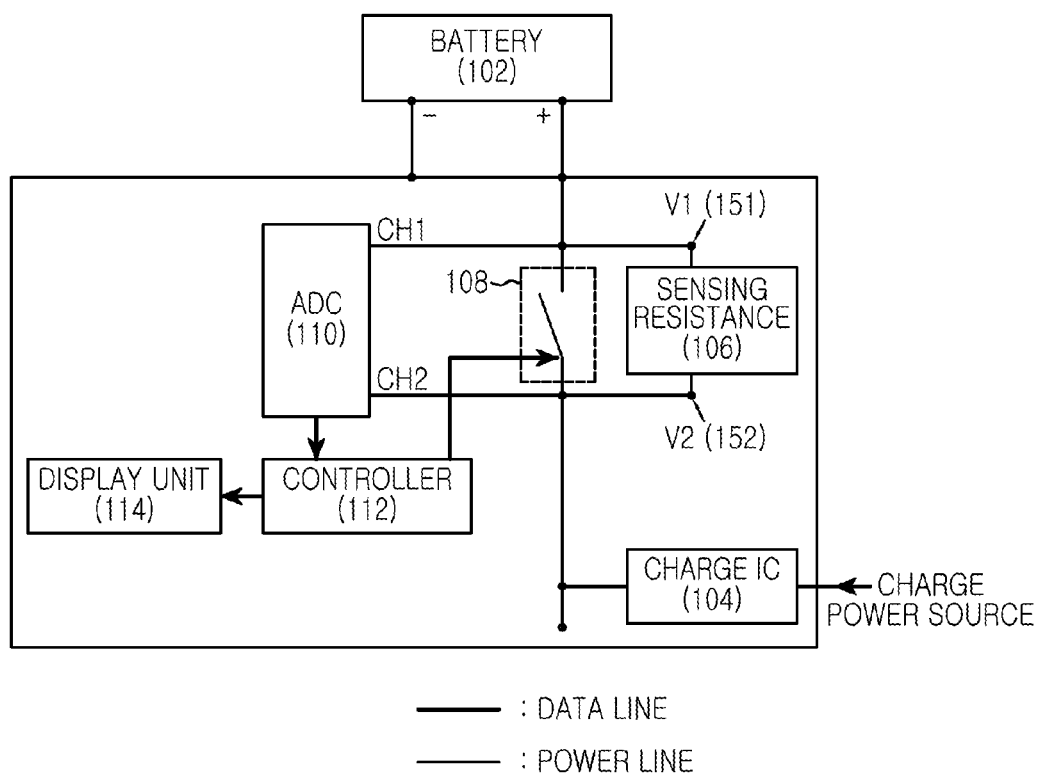
FIG. 1 is a block diagram of a portable device according to an exemplary embodiment of the present invention.

FIG. 1 is a block diagram of a portable device according to an exemplary embodiment of the present invention.

Referring to FIG. 1, the portable device includes a battery 102, a charge Integrated Circuit (IC) 104, a sensing resistance 106, a switch 108, an Analog-to-Digital Converter (ADC) 110, a controller 112, and a display unit 114.

The battery 102, which is a rechargeable power supply source, may be attached and detached to and from the portable device. The charge IC 104 determines whether the portable device is connected with an external source of power. When the external source of power is connected, the charge IC 104 supplies current to the battery 102 to recharge the battery 102 using the external power source. When connected with the external power source, for example, when connected with a charger, the charge IC 104 notifies of the connection to the controller 112.

The sensing resistance 106 is interposed between the battery 102 and the charge IC 104, and measures voltage values required to determine the battery capacity. Hereinafter, among the voltages applied to both ends of the sensing resistance 106, the voltage toward the battery 102 is referred to as V1 151 and the voltage toward the charge IC 104 is referred to as V2 152.

The switch 108 is connected to the sensing resistance 106 in parallel, and controls a current flow to the sensing resistance 106. In more detail, while the switch 108 is normally closed, the switch 108 is opened under the control of the controller 112 when determining the capacity of the battery 102. Accordingly, when the remaining capacity of the battery 102 is determined, the circuit, which is similar to the circuit with the sensing resistance 106 removed, is formed.

The ADC 110 includes two or more input channels and receives the values of the voltage V1 151 and the voltage V2 152 applied to both ends of the sensing resistance 106. That is, the ADC 110 quantizes the V1 151 and the V2 152 and outputs the quantized V1 151 and V2 152 to the controller 112.

The controller 112 controls functions of the portable device. For example, the controller 112 controls open and close operations of the switch 108, and determines the capacity and the charge/discharge state of the battery 102 using the data provided from the ADC 110. The controller 112 provides the display unit 114 with image data indicating the capacity and the charge/discharge state of the battery 102.

The controller 112 may control to close the switch 108 during a normal operation and to open the switch 108 in order to determine the capacity of the battery 102. More specifically, to determine the capacity of the battery 102, the controller 112 forms a circuit with the sensing resistance 106 removed by controlling the switch 108. That is, the controller 112 controls to form a circuit such that current from the battery 102 does not pass through the sensing resistance 106 at any time except during the determination of battery capacity. Thus, in the process of a normal operation, the controller 112 controls to close switch 108 and thus prevents a voltage drop due to the sensing resistance 106.

The controller 112 determines the capacity of the battery 102 using the values of V1 151 and the V2 152 fed from the ADC 110. More specifically, the controller 112 accesses a table showing the battery voltage versus the capacity, and retrieves the capacity value from the table using the voltage of the battery 102 as a look-up parameter. Herein, the voltage of the battery 102 is determined by compensating for the value of V1 151 using the value of V2 152. The value of V1 151 may be regarded as the voltage of the battery 102, but the value of V1 151 may temporarily vary according to the load in the portable device. Hence, the controller 112 estimates the current value based on the difference between the value of V1 151 and the value of V2 152 and compensates for the value of V1 151 using the current value. The compensation of the value of V1 151 is described in more detail below.

For example, when the voltage value used as the look-up parameter to determine the battery capacity is referred to as V0, the deviation of the value measured at V1 151 and V0 increases as the current flowing through the portable device increases. Accordingly, since the current flowing through the portable device is proportional to the difference of the value of V1 151 and the value of V2 152, Equation 1 is defined.

$$V0-V1=K(V1-V2) \quad (1)$$

In Equation 1, V0 denotes the voltage value as an accurate look-up parameter, V1 denotes the value of V1 151, V2 denotes the value of V2 152, and K denotes a proportional constant.

The value of V0 is the voltage value when there is no load on the portable device, that is, when the current is zero. Hence, the proportional constant K can be determined by measuring the value of V1 151 by turning off the portable device or detaching the battery 102 and by determining the value of V1 151 and the value of V2 152 when the portable device is turned on and the fixed current flows. Since the proportional constant K varies according to a design of the portable device and characteristics of the sensing resistance, it is advantageous to define the proportional constant K as described above. Hence, the compensation of the value of V1 151 is given below by Equation 2.

$$V0 = V1 + K(V1 - V2) \quad (2)$$

In Equation 2, V0 denotes the voltage value after the compensation, V1 denotes the value of V1 151, V2 denotes the value of V2 152, and K denotes the proportional constant.

When the charge IC 104 notifies of the connection of the external power source, for example, when the charge IC 104 notifies of the connection with the charger, the controller 112 determines whether the battery 102 is in the charge state or the discharge state using the value of V1 151 and the value of V2 152. More specifically, the controller 112 subtracts the value of V2 152 from the value of V1 151, determines that the battery is in a charge state when the subtraction result is negative, and determines that the battery is in a discharge state when the subtraction result is positive.

The controller 112 generates image data indicating the capacity of the battery 102 and image data showing the charge or discharge state, and provides the image data to the display unit 114.

The display unit 114 displays state information generating in the operations of the portable device, numbers, characters, and images according to execution of an application program. That is, the display unit 114 displays the image data provided from the controller 112 as a visual screen. More particularly, the display unit 114 displays the screen showing the battery capacity and the charge/discharge state. For example, the display unit 114 may be implemented using a Liquid Crystal Display (LCD) and an Organic Light Emitting Diode (OLED).

Figure 2:
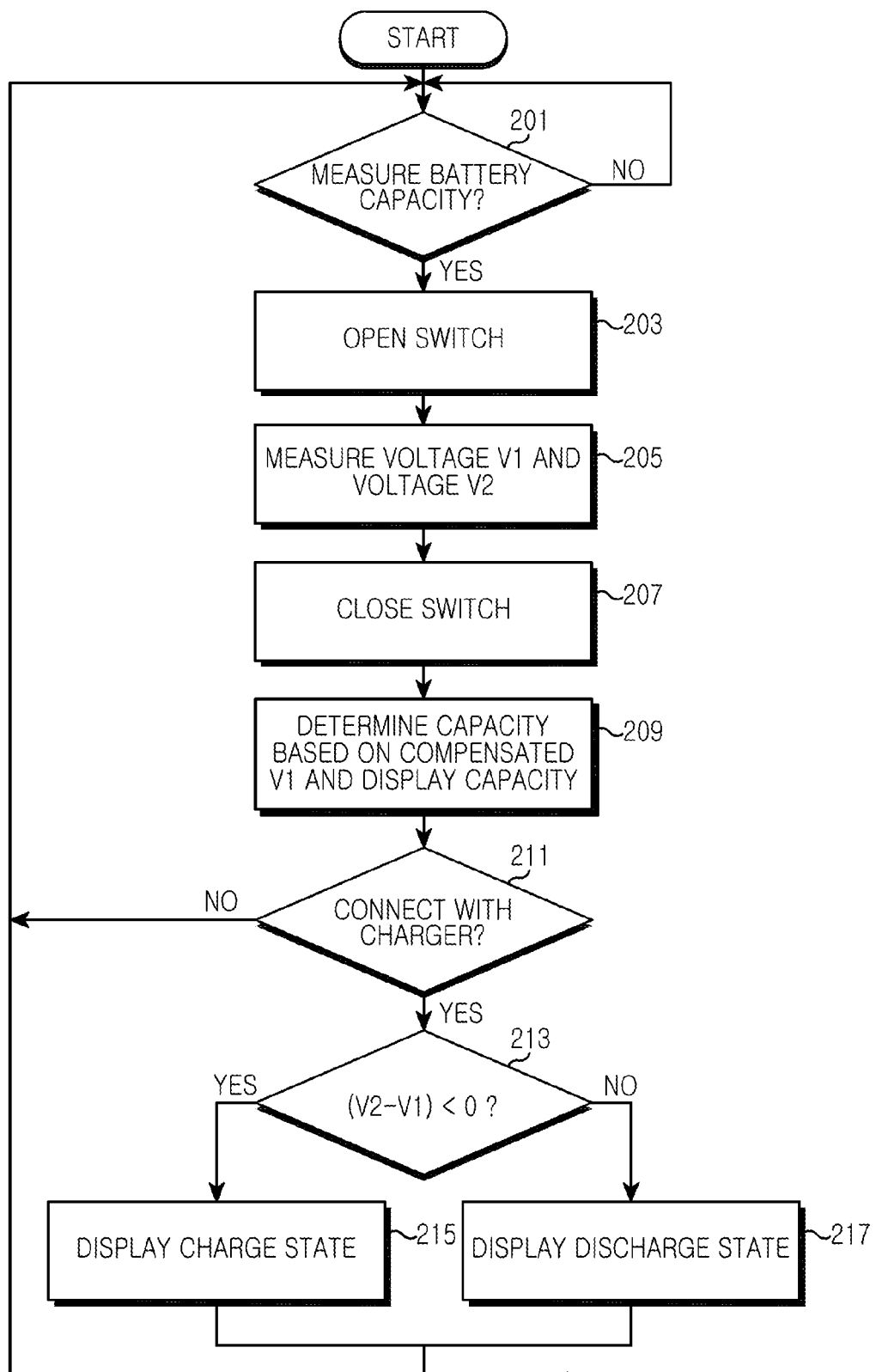
FIG. 2 is a flowchart of operations of a portable device according to an exemplary embodiment of the present invention.

FIG. 2 illustrates operations of a portable device according to an exemplary embodiment of the present invention.

In step 201, the portable device determines whether it is time to measure the battery capacity. For example, the battery capacity may be measured on a periodic basis according to a preset time interval.

When it is determined in step 201 that it is time to measure the battery capacity, the portable device opens a switch connected with a sensing resistance in parallel in step 203. Herein, the sensing resistance is the resistance to measure the voltage values required to determine the battery capacity. The sensing resistance is interposed between the battery and the charge IC. As the switch is opened, the current from the battery flows through the sensing resistance.

In step 205, the portable device measures the voltage V1 and the voltage V2 applied to both ends of the sensing resistance. The value of V1 is the voltage toward the battery and the value of V2 is the voltage toward the charge IC.

The portable device closes the switch in step 207 and thus controls the current of the battery not to pass through the sensing resistance during this time. Generally, the portable device will maintain the switch in a closed state except during a time for battery capacity measurement. That is, although during battery capacity measurement the portable device temporarily opens the switch, this condition exists only during battery capacity measurement. During a normal operation, the portable terminal forms the circuit with the sensing resistance removed. Therefore, in the process of the normal operation, a voltage drop due to the sensing resistance is prevented.

In step 209, the portable device determines the battery capacity using the value of V1 and the value of V2 and displays the screen informing of the determined battery capacity. In so doing, the portable device compensates for the value of V1 using the value of V2, and retrieves the capacity value from a table that compares the battery voltage versus the battery capacity using the compensated value of V1 as a look-up parameter. For example, the portable device determines the compensation value of V1 based on Equation 2.

In step 211, the portable device determines a connection state with an external power source such as a charger. That is, the portable device determines whether it is connected with an external charging voltage. When connected to the external power source, the portable device subtracts the value of V2 from the value of V1 and examines the subtraction result in step 213.

When the subtraction result is negative, the portable device determines the battery in the charge state and displays the screen informing that the battery is recharging in step 215. By contrast, when the subtraction result is positive, the portable device determines the battery in the discharge state and displays the screen informing that the battery is dead in step 217.

As set forth above, by allowing the current to flow to the sensing resistance only in a case of necessity and taking advantage of the conventional voltage measurement compensation method, processing of a battery driver is simplified, computation is reduced, maintenance cost of software is decreased by a simplified compensation processing routine, and reuse of the software is increased.

By processing fluctuation information of the voltage, reliability of the capacity indication, which is the biggest problem of the conventional measurement method, is addressed. Thus, the battery capacity indication method can be provided with low cost and high reliability without using the high-cost current accumulation method.

Further, since recent mobile phones and multimedia devices provide a great number of functions, the mobile phones and the multimedia devices can be discharged because of the considerable current consumption even during the charging. The utilization of the portable device can be enhanced by determining whether the battery is recharging or dead and informing the user of the charge or discharge state.

By allowing the current to flow to the sensing resistance only in case of necessity, the portable device can reduce computation in the capacity measurement and prevent an unnecessary voltage drop caused by the sensing resistance at the same time. In addition, the utilization of the portable device can be enhanced by determining whether the battery is recharging or dead and informing the user of the charge or discharge state.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A portable apparatus using a rechargeable battery, the apparatus comprising:
  a charge Integrated Circuit (IC) for providing current to recharge the battery using an external charge power source;
  a sensing resistance interposed between the battery and the charge IC;
  a switch, connected to the sensing resistance in parallel, for making the current flow to the sensing resistance by being opened when a capacity of the battery is measured; and
  a controller for determining the capacity of the battery using voltage values at both ends of the sensing resistance measured when the switch is opened.

2. The apparatus of claim 1, further comprising:
a display unit for displaying a screen which informs of the battery capacity.

3. The apparatus of claim 1, wherein the controller determines whether the battery is in at least one of a charge state and a discharge state using a subtraction result of the voltage values of both ends of the sensing resistance.

4. The apparatus of claim 3, wherein, among the voltage values, the controller subtracts the voltage value toward the charge IC from the voltage value toward the battery, determines the charge state when the subtraction result is negative, and determines the discharge state when the subtraction result is positive.

5. The apparatus of claim 3, further comprising:
a display unit for displaying a screen which informs of the at least one of the charge state and the discharge state.

6. The apparatus of claim 1, wherein, among the voltage values of both ends of the sensing resistance, the controller compensates for the voltage value toward the battery using the voltage value toward the charge IC, and retrieves a capacity value from a table which arranges battery voltages versus capacities, using the compensated value as a look-up parameter.

7. The apparatus of claim 6, wherein the voltage value toward the battery is compensated based on the following equation:

$$V0 = V1 + K(V1 - V2)$$

where V0 denotes the compensated value, V1 denotes the voltage value toward the battery, V2 denotes the voltage value toward the charge IC, and K denotes a proportional constant.

8. An operating method of a portable device using a rechargeable battery, the portable device comprising a charge Integrated Circuit (IC) for providing current to recharge the battery using an external charge power source, a sensing resistance interposed between the battery and the charge IC, and a switch connected to the sensing resistance in parallel, the method comprising:
when a capacity of the battery is measured, making the current flow through the sensing resistance by opening the switch;
measuring voltage values applied to both ends of the sensing resistance; and
determining the capacity of the battery using the voltage values at both ends of the sensing resistance.

9. The method of claim 8, further comprising:
displaying a screen which informs of the battery capacity.

10. The method of claim 8, further comprising:
determining whether the battery is in at least one of a charge state and a discharge state using a subtraction result of the voltage values of both ends of the sensing resistance.

11. The method of claim 10, wherein the determining of whether the battery is in the at least one of the charge state and the discharge state comprises:
subtracting the voltage value toward the charge IC from the voltage value toward the battery among the voltage values;
determining the charge state when the subtraction result is negative; and
determining the discharge state when the subtraction result is positive.

12. The method of claim 10, further comprising:
displaying a screen which informs of the at least one of the charge state and the discharge state.

13. The method of claim 8, wherein the determining of the battery capacity using the voltage values at both ends of the sensing resistance comprises:
compensating for the voltage value toward the battery using the voltage value toward the charge IC among the voltage values of both ends of the sensing resistance; and
retrieving a capacity value from a table which arranges battery voltages versus capacities, using the compensated value as a look-up parameter.

14. The method of claim 13, wherein the voltage value toward the battery is compensated based on the following equation:

$$V0 = V1 + K(V1 - V2)$$

where V0 denotes the compensated value, V1 denotes the voltage value toward the battery, V2 denotes the voltage value toward the charge IC, and K denotes a proportional constant.

15. An operating method of a portable device using a rechargeable battery, the method comprising:
providing current from a charge Integrated Circuit (IC) to recharge the battery using an external charge power source;
when a capacity of the battery is measured, making a current flow through a sensing resistance interposed between the battery and the charge IC by turning on a switch connected to the sensing resistance in parallel;
measuring voltage values applied to both ends of the sensing resistance; and
determining and displaying the capacity of the battery using the voltage values at both ends of the sensing resistance.

16. The method of claim 15, further comprising:
determining whether the battery is in at least one of a charge state and a discharge state using a subtraction result of the voltage values of both ends of the sensing resistance.

17. The method of claim 16, wherein the determining of whether the battery is in the at least one of the charge state and the discharge state comprises:
subtracting the voltage value toward the charge IC from the voltage value toward the battery among the voltage values;
determining the charge state when the subtraction result is negative; and
determining the discharge state when the subtraction result is positive.

18. The method of claim 16, further comprising:
displaying a screen which informs of the at least one of the charge state and the discharge state.

19. The method of claim 15, wherein the determining of the battery capacity using the voltage values at both ends of the sensing resistance comprises:
compensating for the voltage value toward the battery using the voltage value toward the charge IC among the voltage values of both ends of the sensing resistance; and
retrieving a capacity value from a table which arranges battery voltages versus capacities, using the compensated value as a look-up parameter.

20. The method of claim 19, wherein the voltage value toward the battery is compensated based on the following equation:

$$V0 = V1 + K(V1 - V2)$$

where V0 denotes the compensated value, V1 denotes the voltage value toward the battery, V2 denotes the voltage value toward the charge IC, and K denotes a proportional constant.

* * * * *